(12) United States Patent
Ghabra et al.

(10) Patent No.: US 8,401,066 B2
(45) Date of Patent: Mar. 19, 2013

(54) POWER REGULATOR

(75) Inventors: Riad Ghabra, Dearborn Heights, MI (US); John S. Nantz, Brighton, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 13/053,563

(22) Filed: Mar. 22, 2011

(65) Prior Publication Data

US 2011/0170590 A1 Jul. 14, 2011

Related U.S. Application Data

(63) Continuation of application No. 11/421,243, filed on May 31, 2006, now Pat. No. 7,933,324.

(51) Int. Cl.
*H03K 7/08* (2006.01)

(52) U.S. Cl. ....... 375/238; 340/5.71; 340/429; 340/5.64

(58) Field of Classification Search ............... 330/10; 340/825.22, 825.69, 825.72; 375/238, 295
See application file for complete search history.

(56) References Cited

U.S. PATENT DOCUMENTS

| | | | |
|---|---|---|---|
| 5,128,629 A | | 7/1992 | Trinh |
| 5,182,527 A | | 1/1993 | Nakanishi et al. |
| 5,307,415 A | | 4/1994 | Fosgate |
| 5,442,340 A | * | 8/1995 | Dykema ............ 340/5.25 |
| 5,479,155 A | * | 12/1995 | Zeinstra et al. ............ 340/5.25 |
| 5,506,542 A | | 4/1996 | Hamano et al. |
| 5,847,624 A | | 12/1998 | Pritchett |
| 6,072,404 A | * | 6/2000 | Nolan et al. ............ 340/12.16 |
| 6,681,101 B1 | | 1/2004 | Eidson et al. |
| 6,978,126 B1 | | 12/2005 | Blaker et al. |
| 7,212,415 B2 | | 5/2007 | Osaka |
| 2003/0160647 A1 | | 8/2003 | Easwaran et al. |
| 2004/0207532 A1 | * | 10/2004 | Smithson ............ 340/643 |
| 2005/0057305 A1 | | 3/2005 | Krone |
| 2005/0122163 A1 | | 6/2005 | Chu |
| 2006/0005928 A1 | | 1/2006 | Howald et al. |
| 2006/0192685 A1 | | 8/2006 | Chuey |
| 2007/0052440 A1 | | 3/2007 | Chao et al. |
| 2008/0001660 A1 | * | 1/2008 | Rasmussen ............ 330/10 |

FOREIGN PATENT DOCUMENTS

| | | |
|---|---|---|
| EP | 0926648 A3 | 4/2000 |
| GB | 2300997 A | 11/1996 |
| GB | 2332996 A | 7/1999 |
| JP | 200387069 A | 3/2003 |
| JP | 2005269080 A | 9/2005 |
| WO | 0075905 A1 | 12/2000 |
| WO | WO-0075905 * | 12/2000 |

OTHER PUBLICATIONS

European Search and Examination Report for corresponding Application No. GB0710201.5, mailed Sep. 24, 2007, 7 pages.
German Office Action for corresponding German Application No. DE 10 2007 017 262.3, mailed Aug. 12, 2009, 4 pages.

* cited by examiner

*Primary Examiner* — Leon-Viet Nguyen
(74) *Attorney, Agent, or Firm* — Brooks Kushman P.C.

(57) ABSTRACT

Method and system of power regulating, such as but not limited to attenuating signal power levels. The power regulating being suitable for use in any number of application, environments, and circuits, including but not limited to those associated with a universal garage door opener (UGDO), remote keyless entry (RKE) unit, tire pressure monitor (TPM) unit, and/or a passive entry element. The regulating may be suitable for directly broadcasting the regulated signal and/or communication the regulated signal to other circuit element for further processing.

19 Claims, 2 Drawing Sheets

POWER REGULATOR

CROSS-REFERENCE TO RELATED APPLICATIONS

This application is a continuation of U.S. application Ser. No. 11/421,243 filed May 31, 2006, the disclosure of which is incorporated in its entirety by reference herein.

TECHNICAL FIELD

The present invention relates to regulating output power levels, such as but not limited to regulating output power levels of radio frequency (RF) signals.

BACKGROUND

Signals, including RF signals, are used for many electrically related applications. A device or other signal communicating element may be configured to transmit signals associated with controlling or otherwise manipulating the electrically related application. With respect to universal garage door openers (UGDOs), for example, the UGDO may be required to support communicating signals at different transmission frequencies and/or according to different data protocols, as the UGDO may be required to support certain transmission frequencies and/or data protocols for one particular garage door opener vendor and different frequencies and/or protocols for another.

The Federal Communications Commission (FCC) specifies numerous FCC regulations aimed at governing signal transmissions. The regulations, in some cases, may specify particular signal power levels depending on signal transmission frequencies and data protocols. With respect to the non-limiting example provided above with respect to UGDOs, and because different garage door opener vendors may operate according to different transmission frequencies and/or data protocols, the UGDO may be required to not only support transmitting signals at different frequencies and/or data protocols, but also at different power levels, depending on the FCC regulations associated therewith.

SUMMARY

One non-limiting aspect of the present invention relates to a signal attenuation circuit suitable for attenuating signals to comply with FCC regulations.

One non-limiting aspect of the present invention relates to attenuating signals with pulse-width modulation (PWM) control.

One non-limiting aspect of the present invention relates to attenuating signals as a function of transmission frequencies and/or data protocols.

One non-limiting aspect of the present invention relates to attenuating signals as a function of a programming code associated with particular vendors such that attenuation of multiple vendors having different transmission frequencies and data protocols may be facilitated without hardware reconfigurations.

One non-limiting aspect of the present invention relates to a universal garage door opener (UGDO) having capabilities to attenuate signals for various garage door opener vendors.

One non-limiting aspect of the present invention relates to including the UGDO on a vehicle and facilitate the programming thereof through user interactions with the vehicle.

The above features and advantages, along with other features and advantages of the present invention, are readily apparent from the following detailed description of the invention when taken in connection with the accompanying drawings.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION

Figure 1:
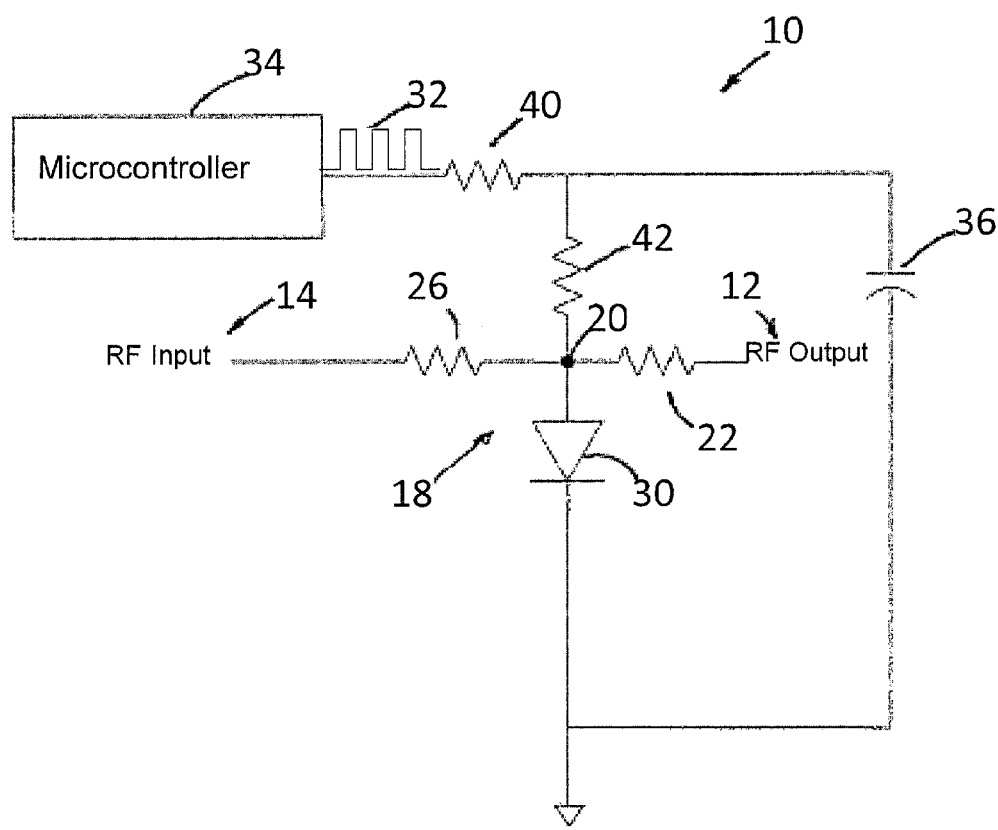
FIG. 1 illustrates an power regulator in accordance with one non-limiting aspect of the present invention.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present i FIG. 1 illustrates an power regulator 10 in accordance with one non-limiting aspect of the present invention. The power regulator 10 may be configured for use in any number of environments and applications, including, but not limited to, those associated with universal garage door openers (UGDOs), tire pressure monitors (TPMs), remote keyless entry (RKE) elements, passive entry elements, and other devices that transmit signals. Of course, the present invention is not intended to be limited to the foregoing and fully contemplates its application with any number of devices and not just those listed above.

The power regulator 10 of the present invention may be configured to regulate power levels of an output signal, shown for exemplary purposes to be a radio frequency (RF) signal 12. The RF output signal 12 be transmitted according to any number of transmission frequencies and/or protocols. An RF input 14 may be included to receive an RF signal from a signal source (not shown), such as an oscillator circuit or other element associated with a device for which power regulation is desired.

For exemplary purposes only and without intending to limited the present invention, the present invention is most prominently described with respect to the signal source being an element or other feature of a UGDO such that the RF signal is that used by the device for controlling operation of a garage door opener or other element. The power regulator 10 of the present invention, therefore, may be an add-on element for use with integrated and discrete circuits.

As described below in more detail, the power regulator 10 may be configured to facilitate regulating output power levels of received signals such that the power regulator 10 need not include capabilities for generating the signals. Rather, as shown in FIG. 1, the power regulator 10 may be configured to regulate existing RF signals, such as but not to attenuating the power levels of the same. The attenuated signals may, for example, then be communicated to other circuit elements for further processing, such as for amplification, and/or wirelessly broadcasted.

The power regulator 10 may include a control circuit 18. The voltage control circuit 18 may be configured to facilitate setting a RF output voltage/current 20 for an output element 22 used to output the RF signal 12. By regulating the RF output voltage/current level 20, the present invention is able to regulate the output power levels of RF signals 12 outputted from the RF output element 22.

The output element 22 is shown to be a resistor, but it may any element suitable for facilitating communication of the attenuated RF signal 12 to another circuit device and/or broadcast element (antenna). The output element 22 may include or be associated with any number of elements and include any number of features and capabilities beyond those associated with simple resistors without deviating from the scope and contemplation of the present invention.

An input element 26 may be included to receive the RF input signal 14 and to communicate the same to the output element 22. The input element 26 is shown to be a resistor, but it may any element suitable for facilitating communication of the RF signal 12 to the output element 22. The input element 26 may include or be associated with any number of elements and include any number of features and capabilities beyond those associated with simple resistors without deviating from the scope and contemplation of the present invention.

A diode or other variable resistance element 30 may be connected between the input and output elements 22, 26 to form a t-network such that a voltage/current across the diode 30 may be used to regulate the RF output voltage/current 20, and thereby, the power level of the RF output signal 12. The diode 30 may be a voltage/current variable diode having a resistance that varies as a function of voltage/current, as one having ordinary skill in the art will appreciate. Of course, the present invention is not limited to t-network configurations and other configurations, such as but not limited to pi-networks, may similarly be used without deviating from the scope and contemplation of the present invention.

The t-network may be configured to act in a manner similar to a voltage divider such that signal power between the input and output is attenuated according to the RF voltage level 20, or more particularly, according to a voltage drop across the diode 30. The voltage drop across the diode 30, which for exemplary purposes may be referred to as a diode voltage, may be regulated as a function of a pulse-width modulation (PWM) signal 32 generated by a microcontroller 34.

The microcontroller 34 may be a standalone element, as shown, and/or integrated, or the function associated therewith, integrated into other features, such as but not limited to a vehicle system controller (not shown). The microcontroller 34 may include processors, memories, and other non-illustrated features to facilitate performing operations and other logical operations associated with generating the PWM signal 32 and executing other operations in accordance with the scope and contemplation of the present invention. Optionally, the microcontroller 34 may be eliminated and replaced with discrete hardware components, such as but not limited switches and timer circuits that may be associated with different timers or other elements suitable for setting various duty cycles and other parameters associated with the microcontroller 34.

The PWM signal 32 may be communicated to a capacitor 36 in order to facilitate controlling capacitor charging and discharging, i.e., the capacitor 36 may be charged during an on-time of the duty cycle and discharged during an off-time of the same. The charging and discharging of the capacitor 36, or more particularly the PWM signal 32, may be regulated such that a constant DC voltage may be provided across the diode 30 for a particular duty cycle of the PWM signal 32. The microcontroller 34 may vary the duty cycle in order to vary the voltage across the diode 30, such as to control the RF output voltage 20.

The diode 30 may be of the type having a resistance that respectively decreases or increases with voltage increases or decreases, as one having ordinary skill in the art will appreciate. These characteristics may be utilized by the present invention in so far as controlling the RF output power level. For example, the diode voltage may be increased to decrease the resistance of the diode 30 and thereby decrease the RF output power level and/or the diode voltage may be decreased to increase the resistance of the diode and thereby increase the RF output power level. Of course, other variable resistance elements may be used without deviating from the scope and contemplation of the present invention.

The ability of the present invention to vary the RF output voltage level by simply varying the PWM signal duty cycle allows the present invention to provide a relatively simple and cost-effective attenuating arrangement for regulating RF output power levels. This arrangement may be included with any number of circuits and circuit elements in order to regulate output levels of any number of signals and signal types.

Optionally, the control circuit 18 may include a first resistive element and second resistive element 40-42, which for exemplary purposes are shown to be resistors but may include any number of features and capabilities beyond those associated with simple resistors. These resistive elements 40-42 may be used to respectively set and smooth current flow to the capacitor and diode. Of course, these elements 40-42 need not necessarily be included in the regulator and the regulator may similarly include more or less elements in order to support these and other operations.

Figure 2:
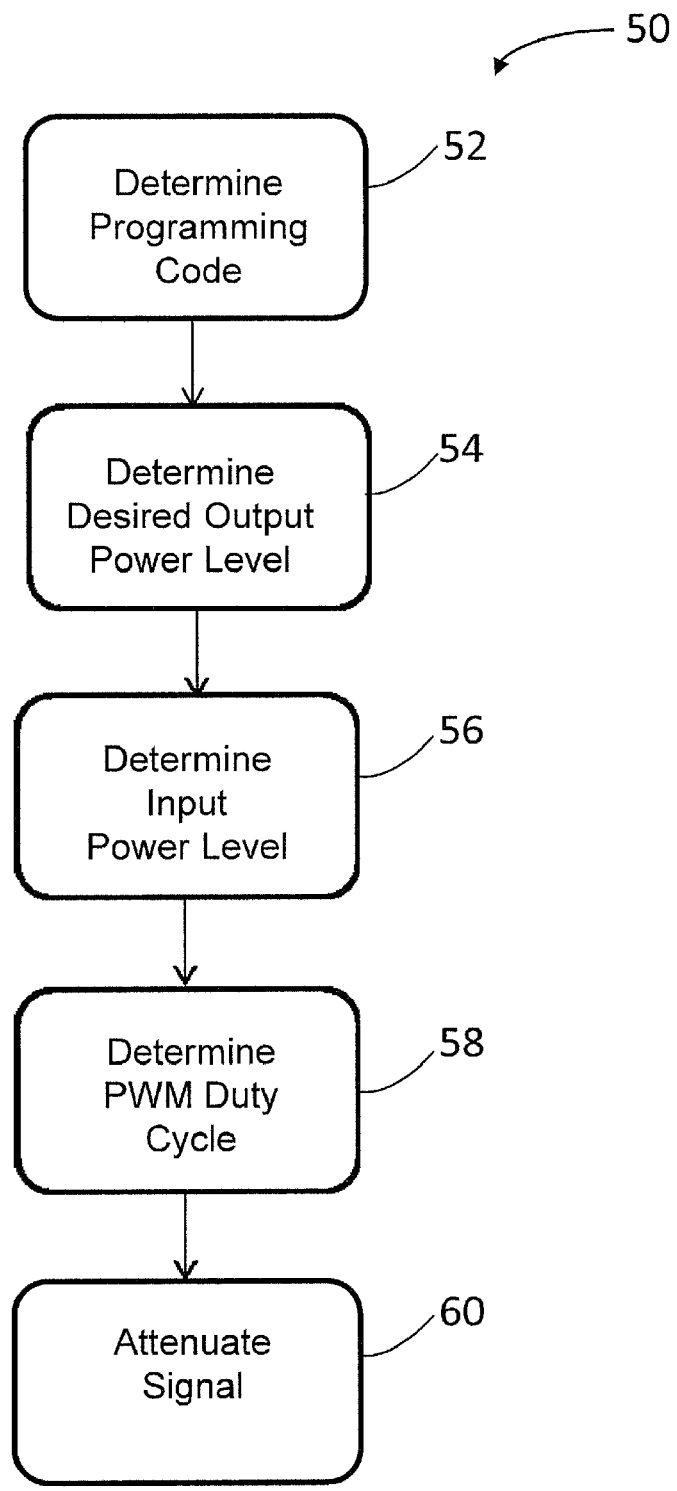
FIG. 2 illustrates a flowchart of a method of regulating output power levels in accordance with one non-limiting aspect of the present invention.

FIG. 2 illustrates a flowchart 50 of a method of regulating output power levels in accordance with one non-limiting aspect of the present invention. The method may be executed according to computer-readable instructions and/or other logically operable commands so as to facilitate controlling and executing operations in accordance with the steps described below and with respect to the same or different elements as those described above.

For exemplary purposes only, the method of the present invention is described with respect to vehicle mounted UGDO and regulating the output power levels of signals communicated from the same. The vehicle UGDO may be of the type which may be included on a vehicle and programmed with inputs, either at the time of manufacturing or thereafter, to transmit signals for controlling garage door to opening/closing and/or to perform other functions generally associated with remote communications. As noted above, the present invention is not intended to be so limited to UGDOs and fully contemplates the same or similar steps being used to regulate power levels for signals associated with TPMs, RKE elements, passive entry elements, and others.

Block 52 relates to determining a programming code for the UGDO. The programming code may be used to specify a garage door opener vendor for which the UGDO is intended to operate. The programming code may be determined as a function of inputs received a vehicle system controller, such as inputs made to a touch-screen and communicated to an on-board computer, and/or other by way of other interactions suitable for establishing the programming code, such through a guess-and-test procedure whereby a user repeatedly attempts to open the garage door while the vehicle control element searches for the appropriate code. Of course, the present invention fully contemplates determining the programming code in any manner and is not intended to be limited to the foregoing processes.

Block 54 relates to determining a desired output power level for the power regulator associated with the UGDO, such as to control power levels of signals communicated to another circuit element (amplifier, filter, etc. circuit) and/or to a broadcast element (antenna). The desired output power level may be determined as a function of the programming code, a vendor associated therewith, and FCC regulations. For example, different programming codes may be associated with different vendors and cross-reference with the transmission frequencies and data protocols of the vendor.

These transmission frequencies and data protocols may be associated with FCC regulations for output power levels such that the appropriate output power level for the particular transmission frequency and data protocol of the vendor may be determined. In this manner, the present invention is able to determine appropriate output power levels for any frequency and/or data protocol used by the garage door opener vendors such that the present invention is able to regulate the output power level to conform to FCC regulations. The regulator of the present invention may be used to support multiple transmission frequencies and data protocols without requiring hardware modifications.

Block 56 relates to determining an input power level for the signal received at the regulator input. The regulator acts essentially as an attenuator in that it decreases power from the input element to the output element in proportion to the diode voltage. Accordingly, the PWM signal used to set the diode voltage may be selected as a function of the input power level in order to insure the input power is attenuated by an amount sufficient to achieve the desired output power level.

Block 58 relates to determining the duty signal of the PWM signal used to set the diode voltage. The PWM signal may be selected, as described above, to insure the power drop between the input element and output element is sufficient to achieve the desired output power level. The microcontroller may then output the appropriate PWM signal. Optionally, the microcontroller may monitor the output power level and adjust the PWM signal as a function thereof, such as to compensate for input power variations or other variations that may cause the output signal to exceed FCC regulations and/or to increase signal power to take advantage of additional power capabilities, such as if the input power level decreases or FCC regulations are relaxed.

Block 60 relates to attenuating the input signal so as to transmit the output signal at the desired output power level. As describe above, this may include regulating the diode voltage so as to control the RF output voltage, and thereby, the output power level of the RF signal. Advantageously, the ability to attentuate the signal with the PWM signal allows the present invention to attenuate signals without requiring more expensive digital-analog converters. nvention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method of attenuating power levels of RF signals being transmitted according to variable transmission frequencies or data protocols, the method comprising:
   determining a desired output power level for the RF signals as a function of the transmission frequency or data protocol of the RF signals;
   receiving the RF signals at a power level greater than the desired output power level;
   attenuating power level of the RF signals to the desired output power level prior to transmission, wherein pulse-width modulation (PWM) of a control circuit is used to attenuate the RF signals to the desired power level; and
   attenuating the RF signals includes selecting a duty cycle for the PWM as a function of the desired output power level and without amplifying the received RF signals.

2. The method of claim 1 further comprising determining the duty cycle as a function of a reduction in power required to in order to transmit the RF signals at the desired output power level.

3. The method of claim 1 further comprising increasing attenuation of the RF signals by increasing an on time of the PWM duty cycle.

4. The method of claim 1 further comprising generating a PWM signal for powering the control circuit, the control circuit including an capacitor and a variable resistance element, the capacitor connected in parallel with the element such that the PWM signal is smoothed by the capacitor to provide DC biasing voltage for the element, the DC biasing voltage setting output power of the RF signals.

5. The method of claim 4 further comprising selecting the variable resistance element to be a diode and dynamically adjusting a duty cycle of the PWM signal during transmission of the RF signals in order to maintain attenuation of the RF signals to the desired power level, the duty cycle being adjusted as a function of changes in temperature of the diode causing variation in power levels of the RF signals.

6. The method of claim 1 further comprising determining the desired output power level as a function of a programming code.

7. The method of claim 6 further comprising determining the programming code as a function of inputs received by a vehicle control element.

8. The method of claim 6 further comprising determining the programming code as a function a universal garage door opener (UGDO) code.

9. The method of claim 6 further comprising determining the programming code as a function of remote keyless entry (RKE) code, tire pressure monitor (TPM) code, or a passive entry element code.

10. A signal attenuation circuit, the circuit comprising:
    an antenna configured to transmit RF signals received at an input node to an output node;
    an attenuation circuit connected between the input and output nodes to attenuate the RF signals prior to being transmitted from the antenna;
    a microcontroller configured to generate a pulse width modulation (PWM) signal to control an amount of attenuation provided by the attenuation circuit,
    the microcontroller generating the PWM signal in proportion to a power level difference between a received power level of the RF signals received at the input node and a desired output power level of the RF signals to be transmitted from the antenna.

11. The circuit of claim 10 further comprising a signal source configured to generate the RF signals of a first power level that is approximately equal to the received power level, the first power level always being greater than the desired output power level, the microcontroller setting the amount of attenuation to a value sufficient to reduce the first power level to the desired output power level, wherein the attenuation circuit connects to the signal source such that the RF signals output from the signal source are provided to the attenuation circuit without amplification.

12. The circuit of claim 10 wherein the microcontroller is configured to generate the PWM signal as a function of at least one of a transmission frequency of the output, a data protocol of the output, and inputs received by a vehicle control element.

13. The circuit of claim 10 wherein the microcontroller is configured to generate the PWM signal as a function a universal garage door opener (UGDO) code, remote keyless entry (RKE) code, tire pressure monitor (TPM) code, or a passive entry element code.

14. The method of claim 1 further comprising generating the RF signals at a constant power level for multiple signal transmissions wherein at least a portion of the multiple signal transmissions occur at different frequencies and according to different data protocols, the constant power level being the power level that is greater than the desired output power level.

15. A universal garage door opener (UGDO) for use within a vehicle to wirelessly control a garage door opener with transmission of RF signals, the UGDO comprising:
a signal source that generates the RF signals according to user inputs received within the vehicle, the signal source generating the RF signals at a first power level;
a RF input that receives the RF signals from the signal source;
a controller that determines an amount of attenuation needed to reduce the RF signals from the first power level to a second power level, the amount of attenuation being based on a difference between the first power level and the second power level, the second power level being determined by the controller according to a transmission frequency or protocol of the RF signals received at the RF input; and
a voltage control circuit that creates a voltage drop between the RF input and an antenna used to transmit the RF signal, the voltage control circuit creating the voltage drop in proportion to a duty cycle of a pulse-width modulated (PWM) signal received from the controller, the controller setting the duty cycle of the PWM signal according to the voltage drop needed between the RF input and the antenna in order to transmit the RF signal with the amount of attenuation needed to reduce the RF signals from the first power level the second power level.

16. The UGDO of claim 15 wherein the voltage control circuit includes a diode connected between the RF input and the antenna to control the voltage drop therebetween, the controller increasing the duty cycle of the PWM signal to increase a voltage across the diode that thereby decreases a resistance of the diode and the second power level, the controller decreasing the duty cycle of the PWM signal to decrease the voltage across the diode that thereby increases the resistance of the diode and the second power level.

17. The UGDO of claim 15 further comprising the signal source generating the RF signal at the first power level regardless of the transmission frequency and protocol of the RF signals, wherein the voltage control circuit receives the RF signals at the first power level such that RF signals are received without being amplified.

18. The UGDO of claim 15 wherein the garage door opener is controllable with RF signals of the first and the second power levels and wherein the RF signals generated by the signal source at the first power level are sufficient to control the garage door opener.

19. The circuit of claim 10 wherein the microcontroller measures received power level of the RF signals received at the input node prior to generating the PWM signal.

* * * * *

UNITED STATES PATENT AND TRADEMARK OFFICE
CERTIFICATE OF CORRECTION

PATENT NO. : 8,401,066 B2
APPLICATION NO. : 13/053563
DATED : March 19, 2013
INVENTOR(S) : Riad Ghabra et al.

Page 1 of 1

It is certified that error appears in the above-identified patent and that said Letters Patent is hereby corrected as shown below:

In the Claims:

Column 6, Line 19, Claim 4;

After "control circuit including"
Delete "an" and insert -- a --.

Signed and Sealed this
Thirtieth Day of July, 2013

Teresa Stanek Rea
*Acting Director of the United States Patent and Trademark Office*